United States Patent
Graham et al.

(10) Patent No.: US 8,993,976 B2
(45) Date of Patent: Mar. 31, 2015

(54) ENERGY SENSORS FOR LIGHT BEAM ALIGNMENT

(75) Inventors: Matthew Graham, San Diego, CA (US); Steven Chang, San Diego, CA (US); Jim Crouch, San Diego, CA (US); Igor Fomenkov, San Diego, CA (US)

(73) Assignee: ASML Netherlands B.V. (NL)

( * ) Notice: Subject to any disclaimer, the term of this patent is extended or adjusted under 35 U.S.C. 154(b) by 740 days.

(21) Appl. No.: 13/249,504

(22) Filed: Sep. 30, 2011

(65) Prior Publication Data
US 2013/0043401 A1 Feb. 21, 2013

Related U.S. Application Data

(60) Provisional application No. 61/525,561, filed on Aug. 19, 2011.

(51) Int. Cl.
G01J 1/42 (2006.01)
G03F 7/20 (2006.01)
H05G 2/00 (2006.01)
G01J 1/16 (2006.01)

(52) U.S. Cl.
CPC ............ *G03F 7/70033* (2013.01); *H05G 2/003* (2013.01); *H05G 2/008* (2013.01)
USPC .......................................... 250/372; 250/395

(58) Field of Classification Search
CPC .................................... G01J 1/42; G01J 1/16
USPC ...................................... 250/372, 395, 504 R
See application file for complete search history.

(56) References Cited

U.S. PATENT DOCUMENTS

| 7,449,704 B2 | 11/2008 | Fomenkov et al. |
| 7,633,070 B2 | 12/2009 | Zywno et al. |
| 2006/0219957 A1 | 10/2006 | Ershov et al. |
| 2009/0095925 A1 | 4/2009 | Ershov et al. |
| 2010/0258750 A1 | 10/2010 | Partlo et al. |
| 2011/0140008 A1 | 6/2011 | Bergstedt et al. |
| 2011/0141865 A1 | 6/2011 | Senekerimyan et al. |

FOREIGN PATENT DOCUMENTS

WO 2011013779 2/2011

OTHER PUBLICATIONS

International Search Report issued on Oct. 26, 2012 by the International Searching Authority, in counterpart application PCT/US12/46093, 2 pages.
Written Opinion issued on Oct. 26, 2012 by the International Searching Authority, in counterpart application PCT/US12/46093, 7 pages.

*Primary Examiner* — David Porta
*Assistant Examiner* — Faye Boosalis
(74) *Attorney, Agent, or Firm* — DiBerardino McGovern IP Group LLC

(57) ABSTRACT

An apparatus includes a drive laser system producing an amplified light beam of pulses that travels along a drive axis; a beam delivery system that directs the amplified light beam of pulses toward a target region; a target material delivery system that provides a target mixture containing a target material in the target region; two or more sensors radially separated from a main axis that crosses the target region, the two or more sensors being configured to detect energy of ultraviolet electromagnetic radiation emitted from a plasma state of the target material when the amplified light beam of pulses intersects the target mixture; and a controller that receives the output from the two or more sensors. The controller is configured to estimate a relative radial alignment between the target mixture and the drive axis within the target region based on an analysis of the detected energy.

30 Claims, 9 Drawing Sheets

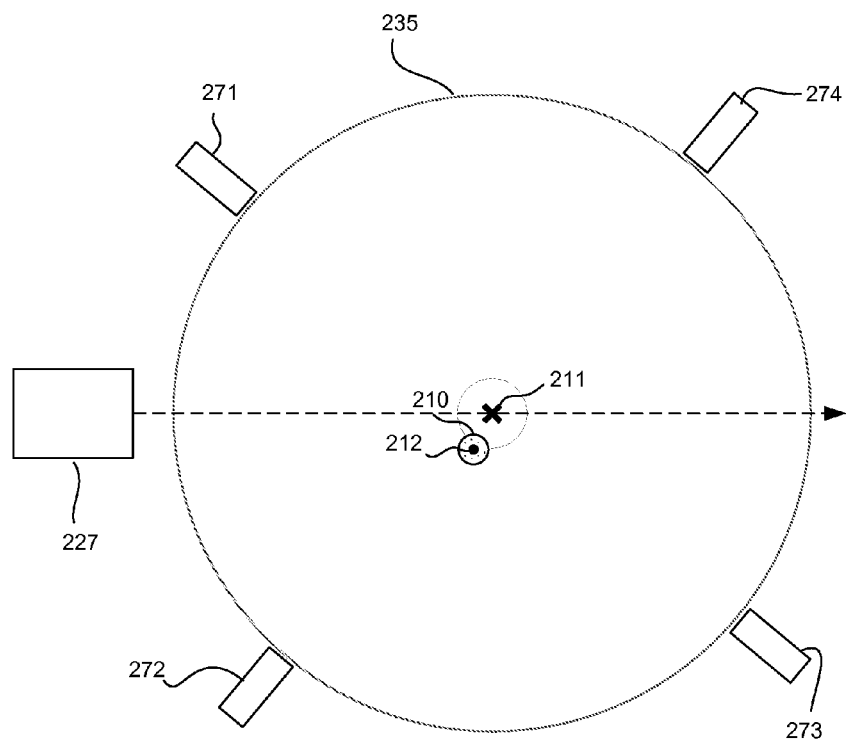
Fig. 5B
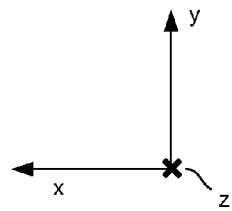

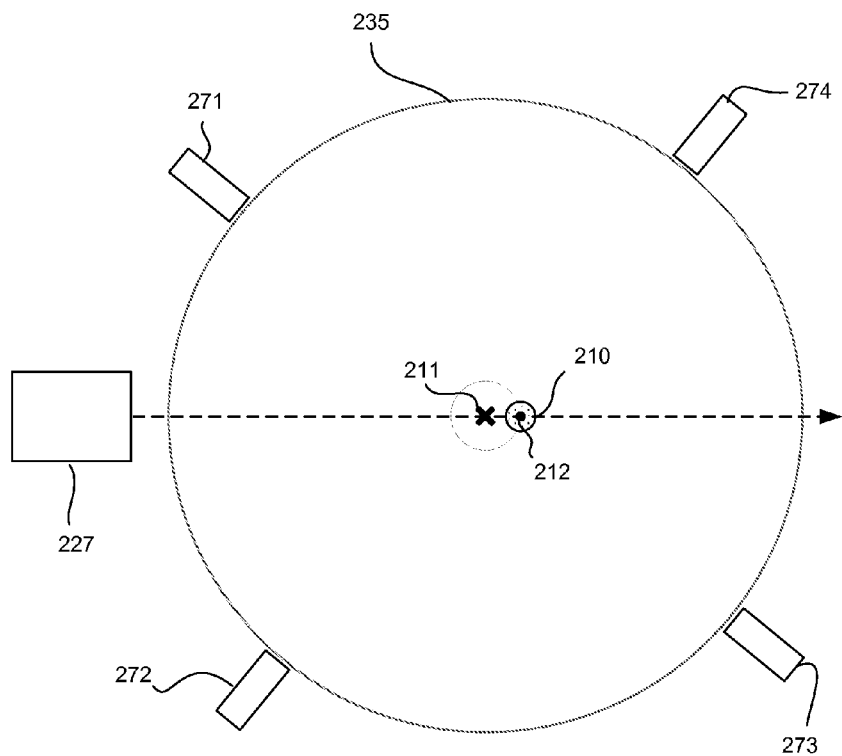
Fig. 5C
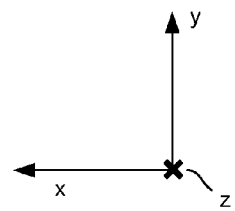

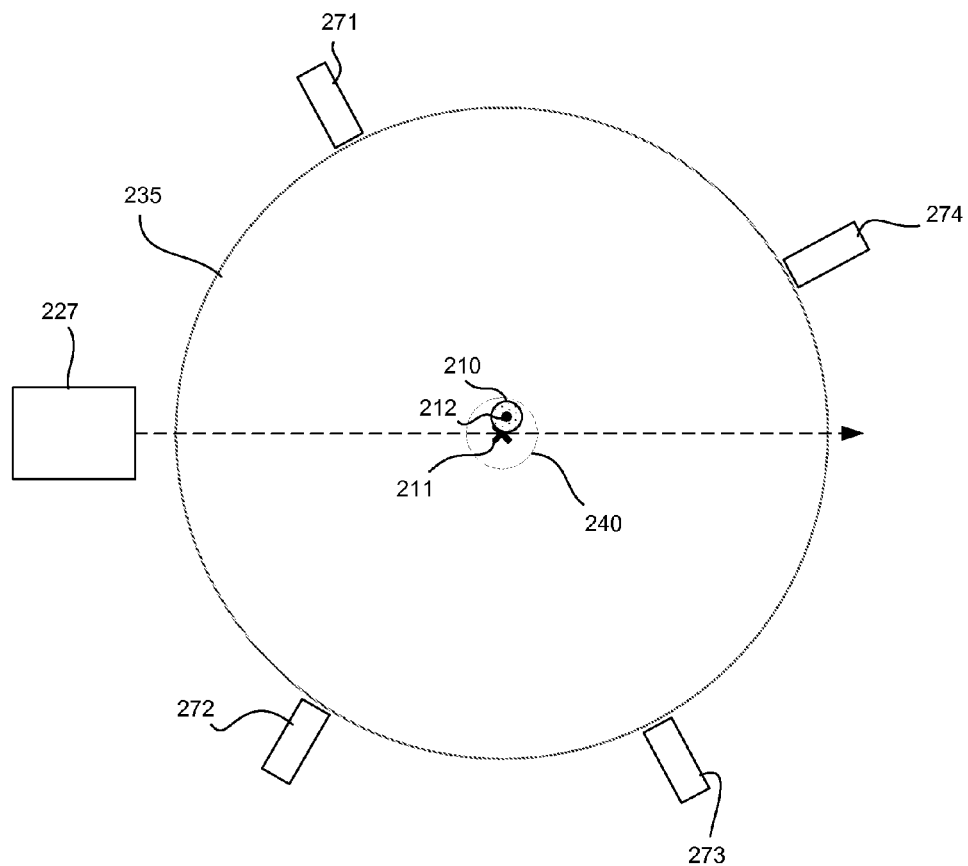
Fig. 8
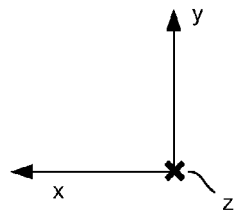

ENERGY SENSORS FOR LIGHT BEAM ALIGNMENT

CROSS REFERENCE TO RELATED APPLICATION

This application claims priority to U.S. Application No. 61/525,561, filed Aug. 19, 2011, which is hereby incorporated by reference in its entirety.

TECHNICAL FIELD

The disclosed subject matter relates to an apparatus for aligning an amplified light beam from a drive laser system relative to a target material at a target region within an extreme ultraviolet light source.

BACKGROUND

Extreme ultraviolet ("EUV") light is electromagnetic radiation having wavelengths of around 50 nm or less and is also sometimes referred to as soft x-rays. EUV light can be used in photolithography processes to produce extremely small features in substrates, for example, silicon wafers. Methods to produce EUV light include, but are not necessarily limited to, converting a material into a plasma state that has an element, for example, xenon, lithium, or tin, with an emission line in the EUV range. In one such method, often termed laser produced plasma ("LPP"), the required plasma can be produced by irradiating a target material, for example, in the form of a droplet, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In some general aspects, a position of an amplified light beam of pulses is adjusted relative to a target material of a target mixture by directing the amplified light beam of pulses along a drive axis toward a target region in which the target mixture is located to thereby convert at least a portion of the target material within the target mixture into a plasma state that emits ultraviolet electromagnetic radiation; detecting the energy of the emitted electromagnetic radiation at two or more locations radially separated from a main axis that crosses the target region; analyzing the detected energy; estimating a relative radial alignment between the target mixture and the drive axis of the amplified light beam within the target region based on the analyzed detected energy; and adjusting a radial alignment of the amplified light beam relative to the target mixture in the target region to thereby adjust the relative radial distance between the target mixture and the drive axis within the target region.

Implementations can include one or more of the following features. For example, the energy of the emitted ultraviolet electromagnetic radiation can be detected by measuring the energy of extreme ultraviolet electromagnetic radiation. The energy of the emitted ultraviolet electromagnetic radiation can be detected by measuring the energy of deep ultraviolet electromagnetic radiation. The emitted ultraviolet electromagnetic radiation can be extreme ultraviolet (EUV) electromagnetic radiation.

The relative radial alignment between the target mixture and the drive axis can be estimated by estimating a radial alignment between the target mixture and the drive axis within the target region.

The radial alignment of the amplified light beam can be adjusted relative to the target mixture by adjusting one or more of a position and an angle of one or more optical elements that steer and move the amplified light beam toward the target mixture within the target region. The one or more of the position and the angle of the one or more optical elements that steer and move the amplified light beam can be adjusted by adjusting one or more of the position and the angle of a curved mirror that redirects the amplified light beam toward the target region.

The energy of the emitted electromagnetic radiation at two or more locations radially separated from the main axis can be detected by measuring the energy of the emitted electromagnetic radiation at four locations radially separated from the main axis.

The method also includes capturing an optical image of a laser beam reflected from the target mixture back toward a drive laser system that supplies the amplified light beam. The relative radial alignment between the target mixture and the drive axis of the amplified light beam within the target region can be estimated at least in part by analyzing the captured image.

The energy of the emitted electromagnetic radiation at two or more locations can be detected by measuring the energy at a rate that is on the order of a pulse repetition rate of the amplified light beam.

The radial alignment of the amplified light beam can be adjusted relative to the target mixture in the target region to thereby reduce the relative radial distance between the target mixture and the drive axis within the target region.

The detected energy can be analyzed by determining a value of a difference between a first total energy of a first set of energies taken at first one or more locations and a second total energy of a second set of energies taken at the second one or more locations, the first one or more locations being distinct from the second one or more locations. The first total energy can be a sum of energies taken at the first one or more locations and the second total energy can be a sum of energies taken at the second one or more locations.

The detected energy can be analyzed by normalizing the difference value by a total energy of all of the energies taken at all of the two or more locations.

The relative radial alignment can be estimated by estimating a radial distance, taken along a first direction that is perpendicular to the main axis, between the target mixture and the drive axis of the amplified light beam within the target region. The relative radial alignment can be estimated by estimating a radial distance, taken along a second direction that is perpendicular to the first direction and to the main axis, between the target mixture and the drive axis of the amplified light beam within the target region.

In another general aspect, an apparatus includes a drive laser system producing an amplified light beam of pulses that travels along a drive axis; a beam delivery system that directs the amplified light beam of pulses toward a target region; a target material delivery system that provides a target mixture containing a target material in the target region; two or more sensors radially separated from a main axis that crosses the target region, the two or more sensors being configured to detect energy of ultraviolet electromagnetic radiation emitted from a plasma state of the target material when the amplified light beam of pulses intersects the target mixture; and a controller that receives the output from the two or more sensors, is configured to analyze the detected energy and estimate a relative radial alignment between the target mixture and the drive axis within the target region based on the analysis, and to output a signal to the beam delivery system to adjust a radial alignment of the amplified light beam relative to the target mixture in the target region to thereby adjust the relative radial distance between the target mixture and the drive axis within the target region.

Implementations can include one or more of the following features. For example, the drive laser system can include one or more optical amplifiers each including a gain medium capable of optically amplifying a desired wavelength at a high gain, an excitation source, and internal optics. The gain medium can include $CO_2$.

The beam delivery system can include a focusing optical element that focuses the amplified light beam to the target region. The target material delivery system can include a nozzle that provides fluid droplets of the target mixture in the target region.

The apparatus can also include a radiation collector that captures and redirects at least a portion of the ultraviolet electromagnetic radiation emitted from the plasma state of the target material when the amplified light beam of pulses intersects the target mixture.

The emitted ultraviolet electromagnetic radiation can include extreme ultraviolet electromagnetic radiation.

The two or more sensors can include at least four sensors that are radially separated from the main axis. Thus, the four sensors can be angularly positioned about the main axis.

At least one of the two or more sensors can be radially separated from the main axis by a distance that is different from a distance that radially separates at least one of the other sensors. All of the two or more sensors can be radially separated from the main axis by the same distance; and thus they can be equidistant from the main axis.

The apparatus can include an imaging device configured to capture an optical image of a laser beam reflected from the target mixture back toward the drive laser system. The controller can also receive the output from the imaging device and can be configured to estimate the relative radial alignment based also on the received output from the imaging device.

The sampling rate of the two or more sensors can be on the order of a pulse repetition rate of the drive laser system.

In another general aspect, a metrology system includes two or more sensors radially separated from a main axis that crosses a target region, the two or more sensors being configured to detect energy of ultraviolet electromagnetic radiation emitted from a plasma state of a target material of a target mixture when an amplified light beam of pulses intersects the target mixture; and a controller that receives the output from the two or more sensors. The controller is configured to analyze the detected energy and estimate a relative radial alignment between the target mixture and the drive axis of the amplified light beam within the target region based on the analysis, and to output a signal to a beam delivery system to adjust a radial alignment of the amplified light beam relative to the target mixture in the target region to thereby adjust the relative radial distance between the target mixture and the drive axis within the target region.

Implementations can include one or more of the following features. For example, the two or more sensors can include at least four sensors that are radially separated from the main axis.

At least one of the two or more sensors can be radially separated from the main axis by a distance that is different from a distance that radially separates at least one of the other sensors.

The metrology system can include an imaging device configured to capture an optical image of a laser beam reflected from the target mixture back toward a drive laser system that produces the amplified light beam. The controller can also receive the output from the imaging device and is configured to estimate the relative radial alignment based also on the received output from the imaging device.

DRAWING DESCRIPTION

Figure 1:
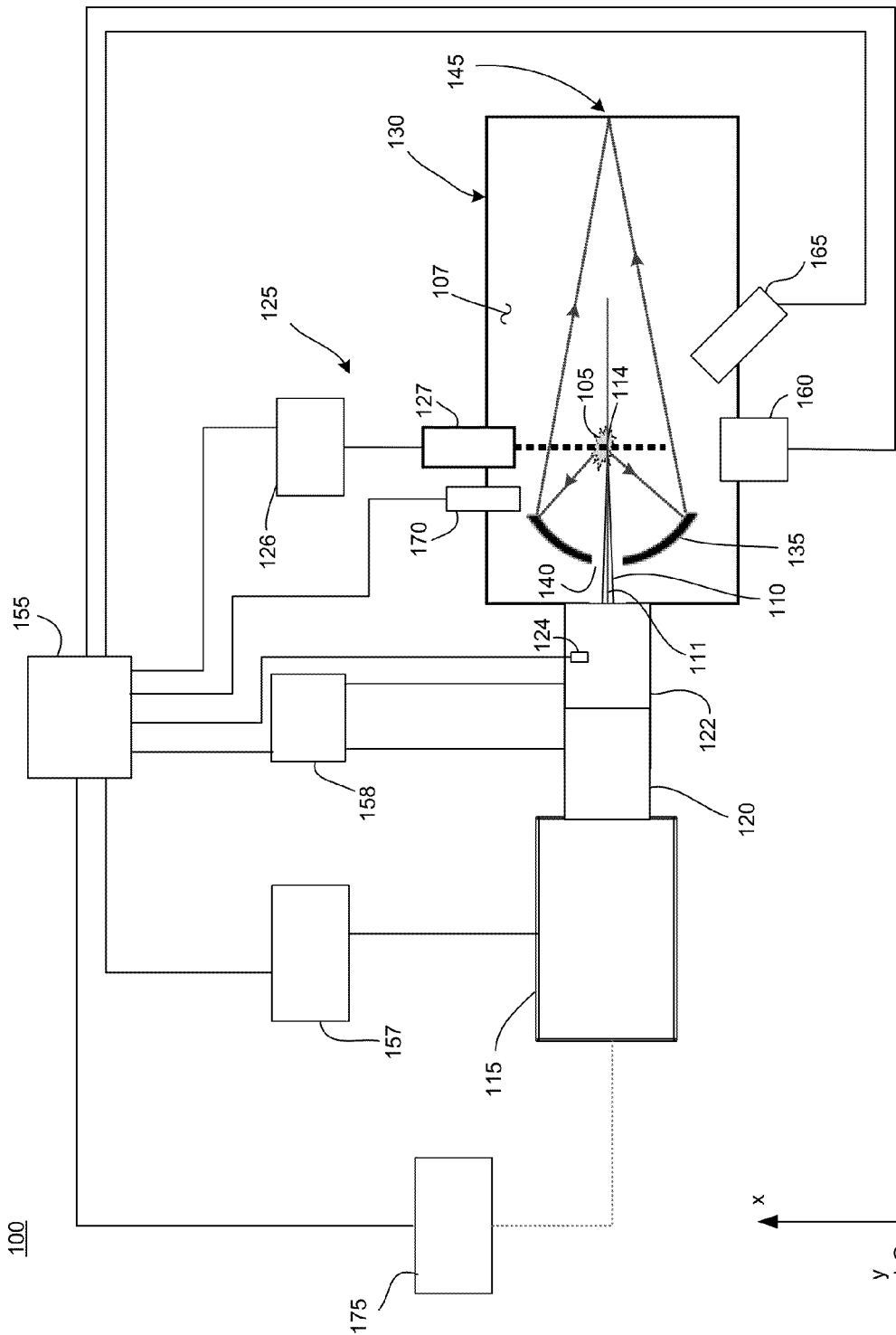
FIG. 1 is a block diagram of a laser produced plasma (LPP) extreme ultraviolet (EUV) light source.
Figure 2:
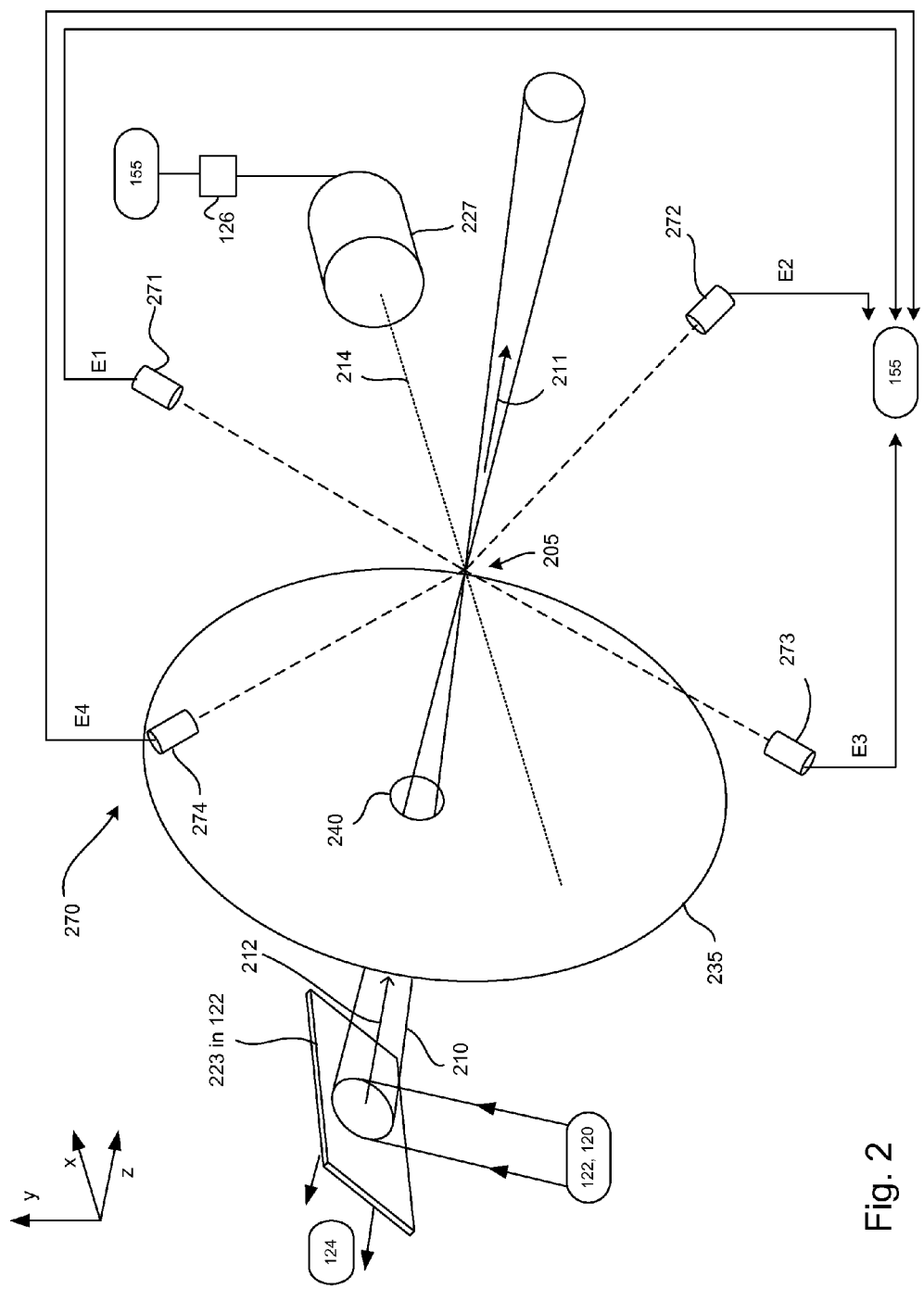
FIG. 2 is a perspective view showing an exemplary target region, a collector mirror, energy detectors, and a target material supply apparatus of the light source of FIG. 1.
Figure 5A:
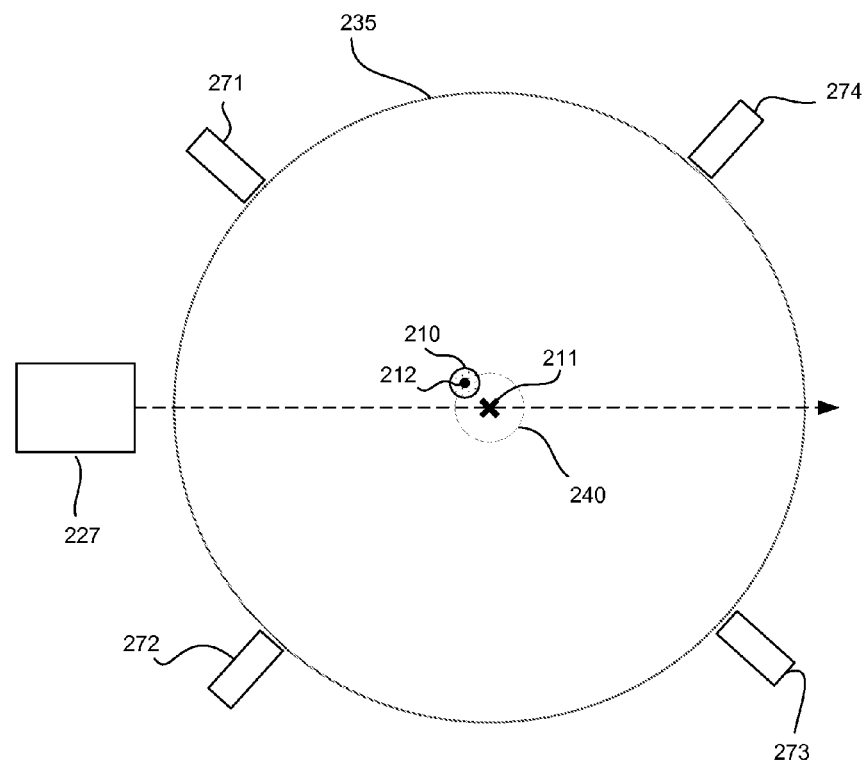
Figure 5A:
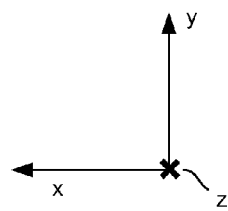
Figure 6:
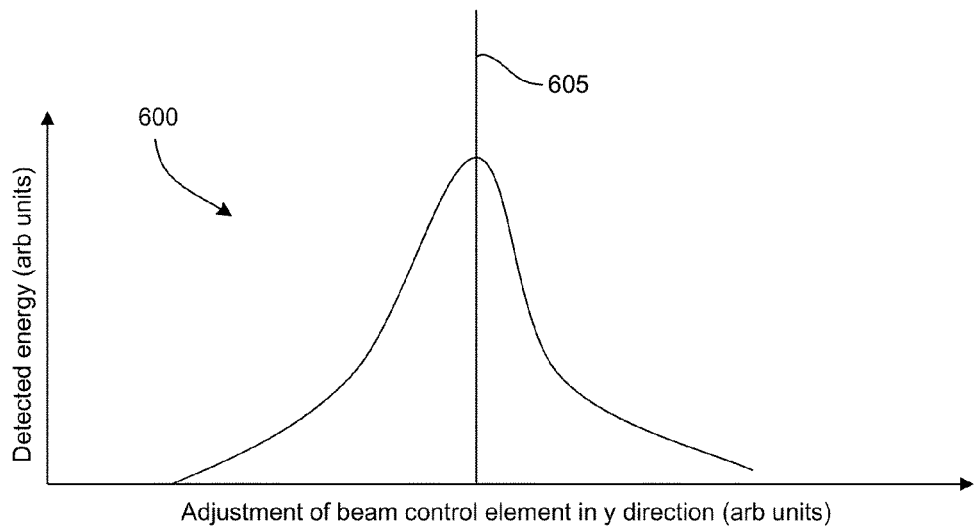
Figure 7:
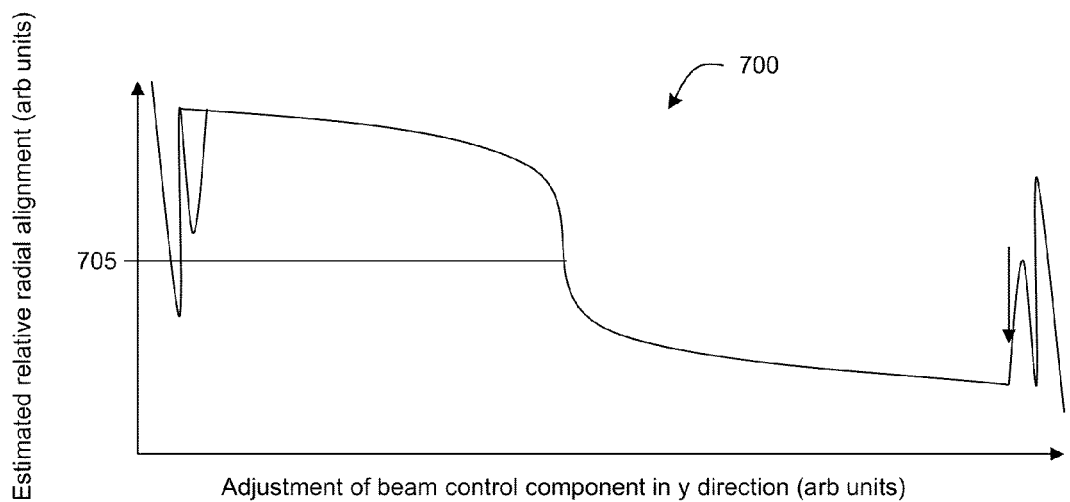

FIGS. 5A-C are views of an exemplary collector mirror, target region, energy sensors, and target material supply apparatus of FIG. 2 taken along a drive axis of an amplified light beam that passes through the collector mirror;

FIG. 6 is an exemplary graph of the total energy Etot as a function of a position of an element within a beam delivery system taken along the y direction of the light source of FIGS. 1 and 2;

FIG. 7 is an exemplary graph of a relative radial alignment RAy between a drive axis of the amplified light beam and a target region as a function of the position of the element within the beam delivery system taken along the y direction of the light source of FIGS. 1 and 2; and FIG. 8 is a view of an exemplary collector mirror, target region, energy sensors, and target material supply apparatus of FIG. 2 taken along a drive axis of the amplified light beam that passes through the collector mirror.

DESCRIPTION

Referring to FIG. 1, an LPP EUV light source 100 is formed by irradiating a target mixture 114 at a target region 105 with an amplified light beam 110 that travels along a drive axis toward the target mixture 114. The drive axis of the amplified light beam 110 can be considered as the approximate center of the beam 110 or the general direction that the beam 110 is traveling because the beam 110 may be irregularly shaped and/or asymmetrical. The drive axis of the amplified light beam 110 can be considered the optical axis of the light beam 110.

The target region 105, which is also referred to as the irradiation site, is within an interior 107 of a vacuum chamber 130. When the amplified light beam 110 strikes the target mixture 114, a target material within the target mixture 114 is converted into a plasma state that has an element with an emission line in the EUV range. The target mixture 114 in the plasma state therefore emits EUV radiation, and the EUV radiation is harnessed by a collector mirror 135, which can be configured to redirect the emitted EUV radiation toward an intermediate location 145, which is also called an intermediate focus.

The created plasma has certain characteristics that depend on the composition of the target material within the target mixture 114. These characteristics can include the wavelength of the EUV radiation produced by the plasma, and the type and amount of debris released from the plasma.

The light source 100 includes two or more sensors 170 radially separated from a main axis 111 that is parallel with the z direction of the page. The main axis 111 crosses the target region 105 and generally extends along a direction that extends from an aperture 140 of a collector mirror 135 toward the target region 105. The radial direction is along the plane that is perpendicular to the main axis 111 in the area of the target region 105. Thus, the radial direction extends along the plane defined by the x and y axes and the two or more sensors 170 are in this plane, which is perpendicular to the main axis 111 in the area of the target region 105. The sensors 170 are positioned around the main axis 111, but they can be at different distances from the main axis 111, and they do not need to be equally spaced from each other.

The sensors 170 are configured to measure energy of the EUV radiation emitted from the plasma state of the target material when the amplified light beam 110 intersects the target mixture 114. In this way, the sensors 170 are configured to sample differences in energy up and down and left and right around the light beam 110 to determine the positional relationship between the light beam 110 and the target region 105.

The light source 100 also includes a master controller 155 that receives an output from the energy sensors 170 and performs an analysis based at least in part on this received output to determine the relative alignment between the drive axis of the amplified light beam 110 and the target mixture 114.

Other features of the light source 100 will be described next before going into greater detail about the energy sensors 170 and the master controller 155.

The light source 100 includes a target material delivery system 125 that delivers, controls, and directs the target mixture 114 in the form of liquid droplets, a liquid stream, solid particles or clusters, solid particles contained within liquid droplets or solid particles contained within a liquid stream. The target mixture 114 includes the target material such as water, tin, lithium, xenon, or any material that, when converted to a plasma state, has an emission line in the EUV range. For example, the target material can be tin, which can be pure tin (Sn); a tin compound such as $SnBr_4$, $SnBr_2$, or $SnH_4$; a tin alloy such as a tin-gallium alloy, a tin-indium alloy, a tin-indium-gallium alloy, or any combination of these alloys. The target mixture 114 can also include impurities such as non-target particles. Thus, in the situation in which there are no impurities, the target mixture 114 is made up of only the target material. The target mixture 114 is delivered by the target material delivery system 125 into the interior 107 of the chamber 130 and to the target region 105.

The light source 100 includes a drive laser system 115 that produces the amplified light beam 110 due to a population inversion within the gain medium or mediums of the laser system 115. The light source 100 includes a beam delivery system between the laser system 115 and the target region 105 to direct the beam 110 from the laser system 115 to the target region 105. The beam delivery system includes a beam transport system 120 and a focus assembly 122. The beam transport system 120 receives the amplified light beam 110 from the laser system 115, and steers and modifies the amplified light beam 110 as needed and outputs the amplified light beam 110 to the focus assembly 122. The focus assembly 122 receives the amplified light beam 110 and focuses the beam 110 to the target region 105. The focus assembly 122 can also steer the beam 110 or adjust a position of the beam 110 relative to the target region 105.

In some implementations, the laser system 115 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is amplified and is also a coherent laser oscillation (and can be referred to as a drive laser beam).

The optical amplifiers in the laser system 115 can include as a gain medium a filling gas that includes $CO_2$ and can amplify light at a wavelength of between about 9100 and about 11000 nm, and in particular, at about 10600 nm, at a gain greater than or equal to 1000. Suitable amplifiers and lasers for use in the laser system 115 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 50 kHz or more. The optical amplifiers in the laser system 115 can also include a cooling system such as water that can be used when operating the laser system 115 at higher powers.

The collector mirror 135 includes the aperture 140 to allow the amplified light beam 110 to pass through and reach the target region 105. The collector mirror 135 can be, for example, an ellipsoidal mirror that has a primary focus at the target region 105 and a secondary focus at the intermediate location 145 (also called an intermediate focus) where the EUV light can be output from the light source 100 and can be input to, for example, an integrated circuit lithography tool (not shown).

The master controller 155 is also connected to a laser control system 157 and a beam control system 158. The master controller 155 can therefore provide a laser position, direction, and timing correction signal to one or more of the laser control system 157 and the beam control system 158. The laser control system 157 can use the correction signal to control the laser timing circuit. The beam control system 158 can use the correction signal to control an amplified light beam position and shaping of the beam transport system 120 to change the location and/or focal power of the beam focal spot within the chamber 130.

The light source 100 can include one or more target or droplet imagers 160 that provide an output indicative of the position of a droplet, for example, relative to the target region 105 and provide this output to the master controller 155, which can, for example, compute a droplet position and trajectory from which a droplet position error can be computed either on a droplet by droplet basis or on average.

The target material delivery system 125 includes a target material delivery control system 126 that is operable, in response to a signal from the master controller 155, for example, to modify the release point of the droplets as released by a target material supply apparatus 127 to correct for errors in the droplets arriving at the desired target region 105.

Additionally, the light source 100 can include one or more photo-detectors 165 that can be used to look at light reflected from the target mixture 114 within the target region 105. The one or more photo-detectors 165 can be placed within the chamber 130 (as shown in FIG. 1) to detect light reflected from the target mixture 114 from a separate test laser (such as a He—Ne laser directed toward the target region 105). In other implementations, the one or more photo-detectors 165 can be placed near the drive laser system 115 to detect the amplified light beam or a guide laser beam (from the guide laser 175) that is back reflected from the target mixture 114.

The light source 100 can also include a guide laser 175 that can be used to align various sections of the light source 100 or to assist in steering the amplified light beam 110 to the target region 105. In connection with the guide laser 175, the light source 100 includes a sampling apparatus 124 that is placed within the focus assembly 122 to sample a portion of light from the guide laser 175 and the amplified light beam 110. In other implementations, the sampling apparatus 124 is placed within the beam transport system 120. The sampling apparatus 124 can include an optical element that samples or redirects a subset of the light, such optical element being made out of any material that can withstand the powers of the guide laser beam and the amplified light beam 110. The sampling apparatus 124 can include an optical sensor that captures images of diagnostic portions of the sampled light, and the optical sensor can output an image signal that can be used by the master controller 155 for diagnostic purposes. An example of such a sampling apparatus 124 is found in U.S. Publication No. 2011/0141865, published on Jun. 16, 2011, which is incorporated herein by reference in its entirety.

A metrology system is formed at least in part from the energy sensors 170 and the master controller 155. The metrology system can also include the sampling apparatus 124, the target imagers 160, and the one or more photo detectors 165. The master controller 155 analyzes the output from the energy sensors 170 (and can also analyze the output from the target imagers 160 and the photo detectors 165) and uses this information to adjust components within the focus assembly 122 or the beam transport system 120 through the beam control system 158, as discussed further below.

Thus, in summary, the light source 100 produces an amplified light beam 110 that is directed along the drive axis to irradiate the target mixture 114 at the target region 105 to convert the target material within the mixture 114 into plasma that emits light in the EUV range. The amplified light beam 110 operates at a particular wavelength (that is also referred to as a source wavelength) that is determined based on the design and properties of the laser system 115. Additionally, the amplified light beam 110 can be a laser beam when the target material provides enough feedback back into the laser system 115 to produce coherent laser light or if the drive laser system 115 includes suitable optical feedback to form a laser cavity.

Referring to FIG. 2, the light source 100 includes, in an exemplary implementation, a target region 205, a collector mirror 235, energy sensors 270, and a target material supply apparatus 227. In this implementation, the energy sensors 270 include four energy sensors 271, 272, 273, 274. The target material supply apparatus 227 can produce droplets of the target mixture 214 in the target region 205 at a rate of over 10 thousand droplets per second and the droplets of the target mixture 214 can be traveling at velocities of about 20 msec. The size of the droplets can be about or greater than about 10 μm in width. The collector mirror 235 includes an aperture 240 that permits an amplified light beam 210 from the laser system 115 to pass through the collector mirror 235 and intersect the target region 205.

In this implementation, the energy sensors 270 are radially separated from the main axis 211 (which is parallel with the z direction) and are angularly arranged about the axis. That is, the energy sensors 270 can be placed in a plane that is perpendicular to the main axis 211 and placed angularly around the main axis 211. Each of the energy sensors 270 (in particular, sensors 271, 272, 273, 274) can be positioned at a radial distance from the main axis 211, and the radial distance of a particular sensor (for example, the sensor 271) may be distinct from a radial distance of another sensor (for example, any of the sensors 272, 273, 274) from the main axis 211. Each energy sensor 270 can be any sensor that is able to observe and measure energy of electromagnetic radiation in the ultraviolet region. Thus, in some implementations the energy sensors 270 are photodiodes, and in other implementations, the energy sensors 270 are photomultiplier tubes.

Prior to use during EUV light production, the energy sensors 270 are calibrated with a known signal on the main axis 211 (that is, at the target region 205) to determine the relative sensitivity of the energy sensors 270. The calibration information is stored and used by the master controller 155 during the analysis. Because of the calibration, it is not necessary for the energy sensors 270 to be radially equidistant from the main axis 211.

The amplified light beam 210 is guided toward the target region 205 to intersect the target material 214 within the target region 205, and the light source 100 can produce enough EUV radiation if the intersection time and area overlap is great enough. For example, in some implementations, the time during which the amplified light beam 210 intersects a droplet of the target material 214 can be between about 1-10 μs. Generally, the drive axis 212 of the amplified light beam 210 should be within a certain radial distance from the target region 205 to produce effective amounts of EUV radiation at the target region 205. But, there may be an acceptable range of radial distance within which the drive axis 212 can be positioned to produce the effective amount of EUV radiation. The light source 100 can be configured to aim the amplified light beam 210 toward the target region 205. Ultimately though, the alignment of the drive axis 212 is determined by the master controller 155 to be that direction and angle of the drive axis 212 that produces at least a minimum amount of EUV radiation and this alignment may not coincide with the main axis 211 or a center of the target region 205.

Figure 3:
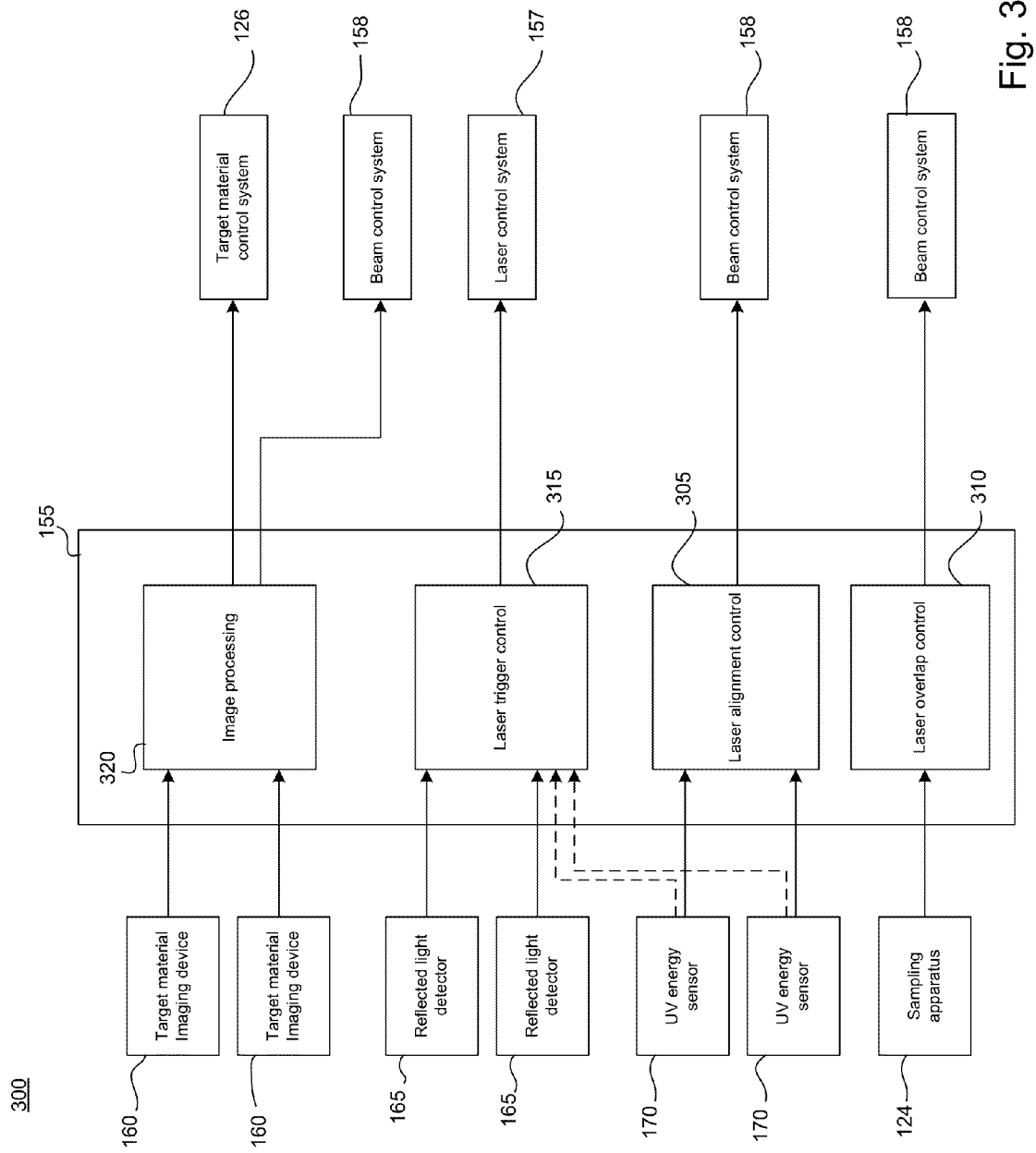
FIG. 3 is a block diagram of a metrology system of the light source of FIG. 1.

Referring to FIG. 3, a metrology system 300 is used to align the drive axis 212 relative to the target region 205 to produce an effective amount of EUV radiation. To this end, the metrology system 300 includes the energy sensors 170 (such as, for example, energy sensors 270), the output of which are fed into an alignment control module 305 of the master controller 155. The master controller 155, in particular, the alignment control module 305, performs a procedure, which is discussed below with respect to FIG. 4, to adjust one or more of a position or angle of the drive axis of the amplified light beam 110 relative to the target region 105 by sending a signal or signals to the beam control system 158 to adjust elements within one or more of the beam transport system 120 and the focus assembly 122. The effective amount of EUV radiation can drop substantially for values of offset between the drive axis of the amplified light beam 110 and the target region 205 as small as 1 μm. Thus, the metrology system 300 can be used to make adjustments to the relative radial alignment on the order of 0.1 to 50 μm.

Though not required, the metrology system 300 can include other components for performing other functions. For example, the metrology system 300 includes the sampling apparatus 124, which outputs an image signal that can be used by an overlap control module 310 of the master controller 155 to calculate features of the image signal and send a signal to the beam control system 158 to tune elements within one or more of the beam transport system 120 and the focus assembly 122, as discussed in greater detail in U.S. Publication No. 2011/0141865.

As another example, the metrology system 300 includes a laser trigger control module 315 that receives and analyzes the output from the photo-detectors 165 and optionally the output from the energy sensors 170, and determines how to adjust a timing of the firing of pulses of the amplified light beam 110 based on the analysis. The laser trigger control module 315 outputs a signal to the laser control system 157, depending on the results of the analysis, to adjust the firing time and rate.

As a further example, the metrology system 300 includes a droplet position module 320 that computes a droplet position and trajectory from which a droplet position error can be computed either on a droplet by droplet basis or on average. The droplet position module 320 thus determines the droplet position error. The output of the module 320 can thus be fed into the target material delivery control system 126, which can use the output to adjust a position or a direction of the target material 114 within the target region 105, or to adjust a timing or rate of target material 114 output from the target material supply apparatus 127. The output of the module 320 can also be fed into the beam control system 158 to tune or adjust elements within one or more of the beam transport system 120 and the focus assembly 122, as needed.

Figure 4:
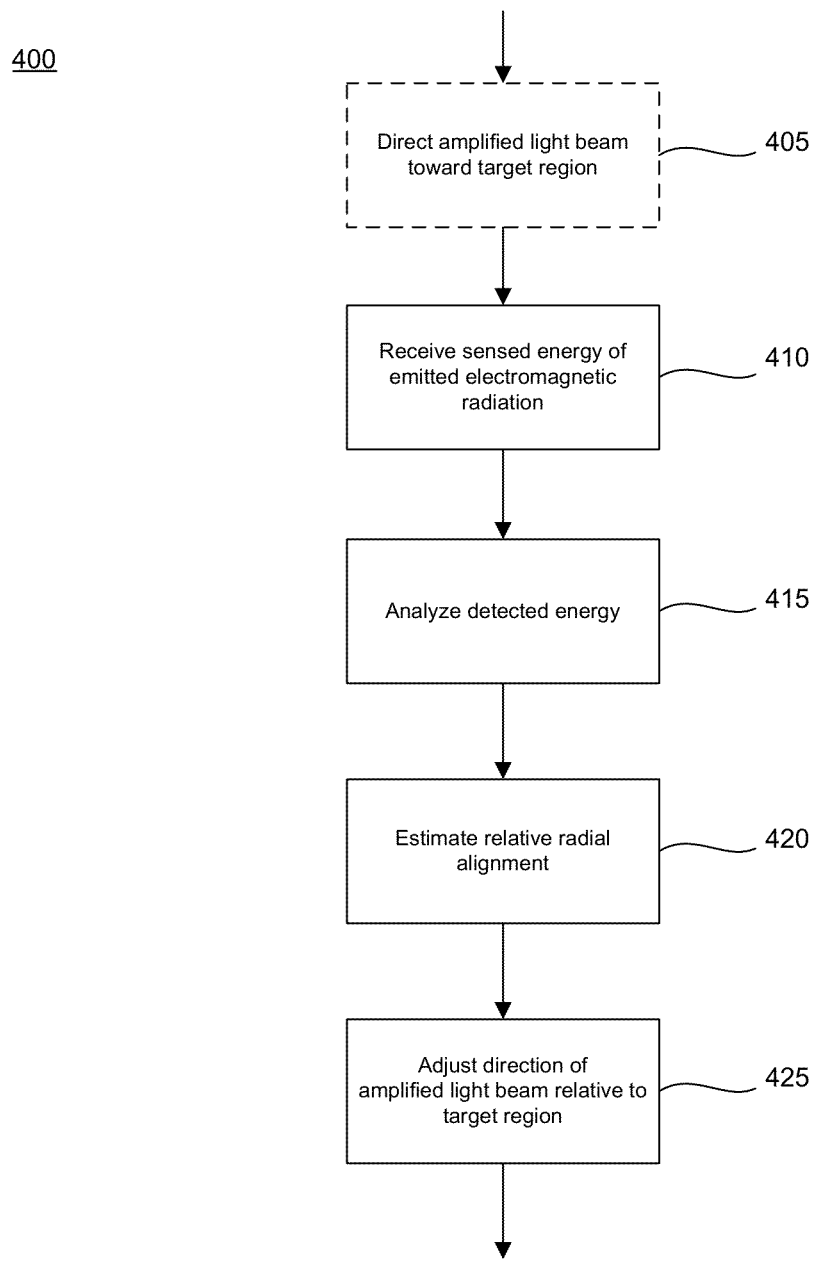
FIG. 4 is a flowchart of a procedure performed by the metrology system of FIG. 3.

Referring to FIG. 4, the metrology system 300 performs a procedure 400 for adjusting a radial alignment of the amplified light beam 110 relative to the target mixture 114. After an initial set up of the light source 100, the master controller 155 sends signals to the laser control system 157 and to the beam control system 158 to direct the amplified light beam 110 from the drive laser system 115 along a drive axis toward the target region 105 in which the target mixture 114 is located (step 405). At least a portion of the target material within the target mixture 114 is converted into a plasma state that emits ultraviolet (for example, EUV) electromagnetic radiation.

Next, the energy sensors 170 detect the energy of the EUV electromagnetic radiation that is emitted from the plasma state of the target material 114, and the master controller 155 receives the output (the sensed energy) from each of the energy sensors 170 (step 410). The master controller 155 analyzes the sensed energy (step 415). In the implementation shown in FIG. 2, the energy sensor 271 outputs the sensed energy E1, the energy sensor 272 outputs the sensed energy E2, the energy sensor 273 outputs the sensed energy E3, and the energy sensor 274 outputs the sensed energy E4 to the master controller 155. The master controller 155 estimates a relative radial alignment RA based on the analyzed sensed energy (step 420). In one exemplary implementation, the master controller 155 estimates a relative radial alignment (RAy) in the y direction based on the following calculation:

$$RAy = \frac{(E1 + E4) - (E2 + E3)}{E1 + E2 + E3 + E4}.$$

Referring also to FIG. 6, an exemplary graph 600 shows the total energy Etot of the energies taken from all of the energy sensors, where Etot=E1+E2+E3+E4 for the implementation shown in FIG. 2, as a function of a position of an element within the beam delivery system taken along the y direction.

Referring also to FIG. 7, an exemplary graph 700 shows the relative radial alignment RAy between the drive axis of the amplified light beam and the target region as a function of the position of an adjustable element within the beam delivery system taken along the y direction. Because the amplified light beam 110 interacts with the adjustable element within the beam delivery system, the adjustment of the element causes the amplified light beam to be moved transversely or angularly relative to the target region. The relative radial alignment RAy follows a path that passes through an inflection value 705 as the element is adjusted along the y direction. The inflection value 705 indicates the point at which the amplified light beam is generally equidistant in the y direction between the energy sensors 271 and 272 and between the energy sensors 274 and 273. As the amplified light beam is offset in the y direction from the equidistant value, the relative radial alignment RAy follows a path away from the inflection value 705.

Thus, the RAy signal can be used to determine the offset of the drive axis 212 of the amplified light beam 210 from the target region 205 (which can be represented by the main axis 212). For example, as shown in FIG. 5A, the drive axis 212 is closer to energy sensors 271 and 274, and thus, RAy is greater than the inflection value 705, and therefore indicates that the energy signals E1 and E4 from the energy sensors 271, 274, respectively, are greater than the energy signals E2 and E3 from the energy sensors 272, 273, respectively. As another example, as shown in FIG. 5B, the drive axis 212 is closer to energy sensors 272 and 273, and thus, RAy is less than the inflection value 705, and therefore indicates that the energy signals E2 and E3 are greater than the energy signals E1 and E4. Referring to FIG. 5C, the drive axis 212 is generally equidistant from the energy sensors 273 and 274 along the y direction and is generally equidistant from the energy sensors 271 and 272 along the y direction. Thus, RAy approaches the inflection value 705.

If the energy sensors 271, 272, 273, 274 were perfectly aligned with the y direction and calibrated so that a signal along the main axis 211 would provide equal energies in each of the energy sensors 271, 272, 273, 274, then the inflection value 705 of RAy would approach 0.

Next, the master controller 155 adjusts a direction of the amplified light beam relative to the target region 105 (step 425). The master controller 155 does this by determining how to adjust the position of one or more elements in the beam delivery system to thereby adjust the position and/or angle of the amplified light beam 110 relative to the target region 105. The master controller 155 then sends a signal to the beam control system 158, which adjusts an actuator that is coupled to the one or more elements, which control a position and/or angle of the amplified light beam. In this way, the relative radial distance between the target mixture and the drive axis of the amplified light beam is adjusted. And, because of this, the total energy of the emitted EUV electromagnetic radiation output from the plasma states of the target material can be improved.

For example, the element within the beam delivery system, when adjusted along the y direction, changes a relative alignment between the drive axis 212 and the target region 205 (which is represented by the main axis 211). The total energy Etot reaches a maximum value for a particular position 605 of the element. Thus, by adjusting the position of the element in the beam delivery system, relative radial distance between the target mixture and the drive axis of the amplified light beam is also adjusted to thereby increase the EUV radiation emitted by the target material in the plasma state to produce more EUV light from the light source 100.

The element or elements that can be adjusted can be one or more of a final focus lens and a mirror within the focus assembly 122. An example of such elements and their adjustment can be found in U.S. Publication No. 2011/0140008, published on Jun. 16, 2011, which is incorporated herein by reference in its entirety. In other implementations, the element that can be adjusted can be a final focus curved mirror within the focus assembly 122. An example of such an element can be found in U.S. Publication No. 2006/0219957, published on Oct. 5, 2066, which is incorporated herein by reference in its entirety.

As another example, and with reference to FIG. 2, a curved mirror 223 can be adjusted by translating the mirror 223 along one or more of the y or x directions or by rotating the mirror 223 about the x or y directions.

The element that can be adjusted can be a mirror, a curved mirror, a lens, or any other component within the beam transport system 120 or the focus assembly 122. Examples of such elements can be found in the beam transport system described in U.S. Publication No. 2011/0140008.

While the discussion above provides an example for adjustment along the y direction, the relative radial alignment can be adjusted along the x direction or along both the x and y directions. For example, the relative radial alignment RAx along the x direction can be given by the below exemplary equation:

$$RAx = \frac{(E1 + E2) - (E3 + E4)}{(E1 + E2 + E3 + E4)}.$$

Moreover, there may be other ways to calculate the relative radial alignment in the x or y directions than the ways noted above. The energy sensors 271, 272, 273, 274 can be placed along different angular positions than the ones shown in FIG. 2, and are not limited to these angular positions. For example, the energy sensors 271, 272, 273, 274 can be placed as shown in FIG. 8. As few as two energy sensors may be used if only the relative radial alignment along one direction need to be known.

The above described metrology system 300 enables higher sampling rates than metrology systems that use only optical data to determine alignment of the amplified light beam. For example, the metrology system 300 can be operated at a rate of one sample (in which the relative radial alignment RA is determined in a sample) per droplet of target mixture at the target region. Moreover, the range and sensitivity of the energy sensors 170 is greater than the range and sensitivity of prior optical detectors used for determining alignment.

By adjusting the relative radial alignment, the EUV production can be increased and the light source 100 can be operated with greater efficiency than in prior systems that lack the metrology system 300 that relies on energy sensors.

Other implementations are within the scope of the following claims.

What is claimed is:

1. A method of adjusting a position of an amplified light beam of pulses relative to a target material of a target mixture, the method comprising:
   directing the amplified light beam of pulses along a drive axis toward a target region in which the target mixture is located to thereby convert at least a portion of the target material within the target mixture into a plasma state that emits ultraviolet electromagnetic radiation;
   detecting the energy of the emitted ultraviolet electromagnetic radiation at two or more distinct locations radially separated from a main axis that crosses the target region;
   analyzing the detected energy;
   estimating a relative radial alignment between the target mixture and the drive axis of the amplified light beam within the target region based on the analyzed detected energy; and
   adjusting a radial alignment of the amplified light beam relative to the target mixture in the target region to thereby adjust the relative radial distance between the target mixture and the drive axis within the target region.

2. The method of claim 1, wherein detecting the energy of the emitted ultraviolet electromagnetic radiation includes detecting the energy of extreme ultraviolet electromagnetic radiation.

3. The method of claim 1, wherein detecting the energy of the emitted ultraviolet electromagnetic radiation includes detecting the energy of deep ultraviolet electromagnetic radiation.

4. The method of claim 1, wherein estimating the relative radial alignment between the target mixture and the drive axis includes estimating a radial alignment between the target mixture and the drive axis within the target region.

5. The method of claim 1, wherein adjusting the radial alignment of the amplified light beam relative to the target mixture includes adjusting one or more of a position and an angle of one or more optical elements that steer and move the amplified light beam toward the target mixture within the target region.

6. The method of claim 5, wherein adjusting one or more of the position and the angle of the one or more optical elements that steer and move the amplified light beam includes adjusting one or more of the position and the angle of a curved mirror that redirects the amplified light beam toward the target region.

7. The method of claim 1, wherein detecting the energy of the emitted ultraviolet electromagnetic radiation at two or more locations radially separated from the main axis includes detecting the energy of the emitted ultraviolet electromagnetic radiation at four locations radially separated from the main axis.

8. The method of claim 1, further comprising capturing an optical image of a laser beam reflected from the target mixture back toward a drive laser system that supplies the amplified light beam;
   wherein estimating the relative radial alignment between the target mixture and the drive axis of the amplified light beam within the target region is also based on analyzing the captured image.

9. The method of claim 1, wherein detecting the energy of the emitted ultraviolet electromagnetic radiation at two or more locations includes detecting the energy at a rate that is on the order of a pulse repetition rate of the amplified light beam.

10. The method of claim 1, wherein adjusting the radial alignment of the amplified light beam relative to the target mixture in the target region thereby reduces the relative radial distance between the target mixture and the drive axis within the target region.

11. The method of claim 1, wherein analyzing the detected energy comprises determining a value of a difference between a first total energy of a first set of energies taken at first one or more locations and a second total energy of a second set of energies taken at the second one or more locations, the first one or more locations being distinct from the second one or more locations.

12. The method of claim 11, wherein the first total energy is a sum of energies taken at the first one or more locations and the second total energy is a sum of energies taken at the second one or more locations.

13. The method of claim 11, wherein analyzing the detected energy comprises normalizing the difference value by a total energy of all of the energies taken at all of the two or more locations.

14. The method of claim 1, wherein estimating a relative radial alignment comprises estimating a radial distance, taken along a first direction that is perpendicular to the main axis, between the target mixture and the drive axis of the amplified light beam within the target region.

15. The method of claim 14, wherein estimating a relative radial alignment comprises estimating a radial distance, taken along a second direction that is perpendicular to the first direction and to the main axis, between the target mixture and the drive axis of the amplified light beam within the target region.

16. An apparatus comprising:
a drive laser system producing an amplified light beam of pulses that travels along a drive axis;
a beam delivery system that directs the amplified light beam of pulses toward a target region;
a target material delivery system that provides a target mixture containing a target material in the target region;
two or more sensors radially separated at distinct locations from a main axis that crosses the target region, the two or more sensors being configured to detect energy of ultraviolet electromagnetic radiation emitted from a plasma state of the target material when the amplified light beam of pulses intersects the target mixture; and
a controller that receives the output from the two or more sensors, is configured to analyze the detected energy and estimate a relative radial alignment between the target mixture and the drive axis within the target region based on the analysis, and to output a signal to the beam delivery system to adjust a radial alignment of the amplified light beam relative to the target mixture in the target region to thereby adjust the relative radial distance between the target mixture and the drive axis within the target region.

17. The apparatus of claim 16, wherein the drive laser system includes one or more optical amplifiers each including a gain medium capable of optically amplifying a desired wavelength at a high gain, an excitation source, and internal optics.

18. The apparatus of claim 17, wherein the gain medium includes $CO_2$.

19. The apparatus of claim 16, wherein the beam delivery system includes a focusing optical element that focuses the amplified light beam to the target region.

20. The apparatus of claim 16, wherein the target material delivery system includes a nozzle that provides fluid droplets of the target mixture in the target region.

21. The apparatus of claim 16, further comprising a radiation collector that captures and redirects at least a portion of the ultraviolet electromagnetic radiation emitted from the plasma state of the target material when the amplified light beam of pulses intersects the target mixture.

22. The apparatus of claim 16, wherein the emitted ultraviolet electromagnetic radiation includes extreme ultraviolet electromagnetic radiation.

23. The apparatus of claim 16, wherein the two or more sensors include at least four sensors that are radially separated from the main axis.

24. The apparatus of claim 16, wherein at least one of the two or more sensors is radially separated from the main axis by a distance that is different from a distance that radially separates at least one of the other sensors.

25. The apparatus of claim 16, further comprising an imaging device configured to capture an optical image of a laser beam reflected from the target mixture back toward the drive laser system;
wherein the controller also receives the output from the imaging device and is configured to estimate the relative radial alignment based also on the received output from the imaging device.

26. The apparatus of claim 16, wherein the sampling rate of the two or more sensors is on the order of a pulse repetition rate of the drive laser system.

27. A metrology system comprising:
two or more sensors radially separated at distinct locations from a main axis that crosses a target region, the two or more sensors being configured to detect energy of ultraviolet electromagnetic radiation emitted from a plasma state of a target material of a target mixture when an amplified light beam of pulses intersects the target mixture; and
a controller that receives the output from the two or more sensors, is configured to analyze the detected energy and estimate a relative radial alignment between the target mixture and the drive axis of the amplified light beam within the target region based on the analysis, and to output a signal to a beam delivery system to adjust a radial alignment of the amplified light beam relative to the target mixture in the target region to thereby adjust the relative radial distance between the target mixture and the drive axis within the target region.

28. The metrology system of claim 27, wherein the two or more sensors include at least four sensors that are radially separated from the main axis.

29. The metrology system of claim 27, wherein at least one of the two or more sensors is radially separated from the main axis by a distance that is different from a distance that radially separates at least one of the other sensors.

30. The metrology system of claim 27, further comprising an imaging device configured to capture an optical image of a laser beam reflected from the target mixture back toward a drive laser system that produces the amplified light beam;
wherein the controller also receives the output from the imaging device and is configured to estimate the relative radial alignment based also on the received output from the imaging device.

\* \* \* \* \*